United States Patent
Stegers

(10) Patent No.: US 6,630,898 B1
(45) Date of Patent: Oct. 7, 2003

(54) LOW VOLTAGE, UNIT DELAY QUANTIZER WITH FEEDFORWARD AUTO-ZERO MECHANISM

(75) Inventor: Marc Gerardus Maria Stegers, Delft (NL)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/929,909

(22) Filed: Aug. 14, 2001

(51) Int. Cl.$^7$ ................................................ H03M 1/12
(52) U.S. Cl. ....................... 341/172; 341/143; 341/200; 341/68; 341/69
(58) Field of Search ......................... 341/172, 200, 341/143, 68, 69; 330/9

(56) References Cited

U.S. PATENT DOCUMENTS

| | | | | |
|---|---|---|---|---|
| 4,633,223 A | * | 12/1986 | Senderowicz | 341/172 |
| 4,803,462 A | * | 2/1989 | Hester et al. | 341/172 |
| 5,030,954 A | * | 7/1991 | Ribner | 341/172 |
| 5,572,107 A | * | 11/1996 | Koch et al. | 341/172 |
| 5,729,232 A | * | 3/1998 | Fujimori | 341/172 |
| 5,894,284 A | * | 4/1999 | Garrity et al. | 341/172 |
| 6,091,300 A | * | 7/2000 | Setty et al. | 181/102 |
| 6,242,974 B1 | * | 6/2001 | Kunst | 330/9 |

* cited by examiner

Primary Examiner—Jean Bruner Jeanglaude
(74) Attorney, Agent, or Firm—Brett A. Hertzberg; Merchant & Gould

(57) ABSTRACT

An auto-zeroed quantizer that has a unit delay characteristic employs switched capacitor techniques to adjust the input common-mode voltage to a proper common-mode voltage for the quantizer. A feed-forward auto-zero scheme is used to initialize the apparatus during an initialization phase. After the initialization phase, a differential input signal is amplified to provide a differential amplified signal. A positive feedback circuit is subsequently activated to increase the difference in the differential amplified signal until the difference saturates at a logic level. The logic level decision is stored in a memory circuit such as a latch. The unit delay quantizer may be utilized in a converter circuit such as a $\Delta\Sigma$ modulator.

25 Claims, 6 Drawing Sheets

FIGURE 3 (INITIALIZATION MODE)

(COMPARE MODE)

LOW VOLTAGE, UNIT DELAY QUANTIZER WITH FEEDFORWARD AUTO-ZERO MECHANISM

FIELD OF THE INVENTION

The present invention relates generally to quantization circuits. More particularly, the present invention relates to an apparatus and method that uses a feed-forward auto-zero technique, and a positive feedback arrangement to increase the signal to acceptable logic levels. Switched capacitor techniques are used to adjust the common-mode voltage for reduced power-supply voltage requirements.

BACKGROUND OF THE INVENTION

A one-bit over-sampling analog-to-digital converter (600) is depicted in FIG. 6. This type of analog-to-digital converter (ADC) is often referred to as a first order delta-signal (ΔΣ) modulator. As shown in the figure, the first order ΔΣ-modulator (600) includes a summer (601), an integrator (602), a 1-bit ADC (603) a digital low pass filter (604), and a 1-bit digital-to-analog converter (605). The first order ΔΣ-modulator (600) receives an analog signal and produces an N-bit digital code output.

In operation, an analog signal and an output of 1-bit digital-to-analog converter (DAC) 605 are fed into summer 601. The summer (601) provides an output that corresponds to the difference between the analog input signal and the output of DAC 605. The integrator (602) provides an integration signal in response the difference signal. The 1-bit ADC (603) produces a digital bit by converting by comparing the integration signal to a predetermined threshold level (i.e., mid-supply level). This digital bit is fed into the 1-bit DAC, which produces an analog voltage that corresponds to one of two voltages (i.e., +VREF and −VREF). Digital low pass filter (LPF) 604 receives the digital bit from the 1-bit ADC (603) and produces an N-bit digital code output.

SUMMARY OF THE INVENTION

The present invention is directed to an apparatus and method for an auto-zeroed quantizer that has a unit delay characteristic. Switched capacitor techniques are employed to adjust the input common-mode voltage to a proper common-mode voltage for the quantizer. A feed-forward auto-zero scheme is used to initialize the apparatus during an initialization phase. After the initialization phase, a differential input signal is amplified to provide a differential amplified signal. A positive feedback circuit is subsequently activated to increase the difference in the differential amplified signal until the difference saturates at a logic level. The logic level decision is stored in a memory circuit such as a latch. The unit delay quantizer may be utilized in a converter circuit such as a ΔΣ modulator.

According to a first aspect of the invention, an apparatus is directed to provide a quantized differential output signal in response to a differential input signal. The apparatus includes a differential amplifier. The differential amplifier includes a differential input that is coupled to the differential input signal, and a first and second output that are arranged to provide a differential intermediate signal in response to the differential input signal during an amplification phase. The amplification phase is activated after an initialization phase is complete. An auto-zero circuit is coupled to the first and second output of the differential amplifier. The auto-zero circuit is arranged to initialize the differential intermediate signal during an initialization phase. The differential intermediate signal is substantially zero differentially after the initialization phase is complete. A positive gain circuit is coupled to the differential output of the differential amplifier. The positive gain circuit is arranged to increase the gain of the differential intermediate signal during a decision phase such that the differential intermediate signal saturates to a differential logic level. The decision phase is activated after the amplification phase is complete. The quantized differential output signal is associated with the differential intermediate signal at the end of the decision phase.

According to a second aspect of the invention, an apparatus is directed to quantizing a differential input signal. The apparatus includes a means for adjusting. The means for adjusting is arranged to receive the differential input signal and provide a first intermediary differential signal that corresponds to the differential input signal with an adjusted common-mode voltage. A means for amplifying is arranged to receive the first intermediary differential signal and provide a second intermediary differential signal when the apparatus is in an amplification phase after an initialization phase is complete. The second intermediary differential signal corresponds to the first intermediary differential signal that is increased in amplitude by a gain factor. A means for disabling is arranged to disable the means for amplifying when the apparatus is in the initialization phase. A means for initializing is coupled to the means for amplifying and arranged to initialize the second intermediary differential signal during the initialization phase such that the second intermediary differential signal is substantially zero at the end of the initialization phase. A means for providing positive feedback is coupled to the means for amplifying and arranged to increase the amplitude of the second intermediary differential signal during the decision phase. The increased amplitude corresponds to a logic level. A means for storing is coupled to the increased amplitude second intermediary signal and arranged to store the logic level of the increased amplitude second intermediary signal at the end of the decision phase.

According to a third aspect of the invention, a method is directed to quantizing a differential input signal. The method includes adjusting the common-mode voltage of the differential input signal to provide an intermediary signal. By amplifying the first intermediary signal, an amplified signal is provided during an amplification phase and after an initialization phase. The amplified signal is initialized to a value that corresponds to a zero difference differential signal during the initialization phase. Positive feedback is provided to the amplified signal to provide a decision signal during a decision phase and after the amplification phase. The decision signal is a logic level signal that is associated with the polarity of the amplified signal. The decision signal is latched at the conclusion of the decision phase to provide a quantized signal.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal, electromagnetic wave signal, or data signal. The meaning of "a", "an", and "the" include plural references. The meaning of "in" includes "in" and "on".

The present invention relates generally to quantization circuits. More particularly, the present invention relates to an apparatus and method that uses a feed-forward auto-zero technique, and a positive feedback arrangement to increase the signal to acceptable logic levels. Switched capacitor techniques are used to adjust the common-mode voltage for reduced power-supply voltage requirements.

Switched capacitor circuits may be used in delta-sigma modulator (ΔΣ-modulator) type analog-to-digital converters (ADC) as integrator circuits. The output of the integrator circuits are provided to a quantizer that converts the integrated output signals into a digital code bit. The present invention employs a quantizer circuit that includes a comparator circuit that is arranged within a switched capacitor configuration. The switched capacitors are configured to automatically adjust the input common-mode voltage for the comparator circuit. A feed-forward technique is used to auto-zero the comparator circuit. The switched capacitor circuit is arranged to provide a common-mode input voltage for the comparator circuit to work at very low power supply levels on the order of 1.8V.

The operating environment for the quantizer circuit is described below with reference to FIG. 1.

Operating Environment

Figure 1:
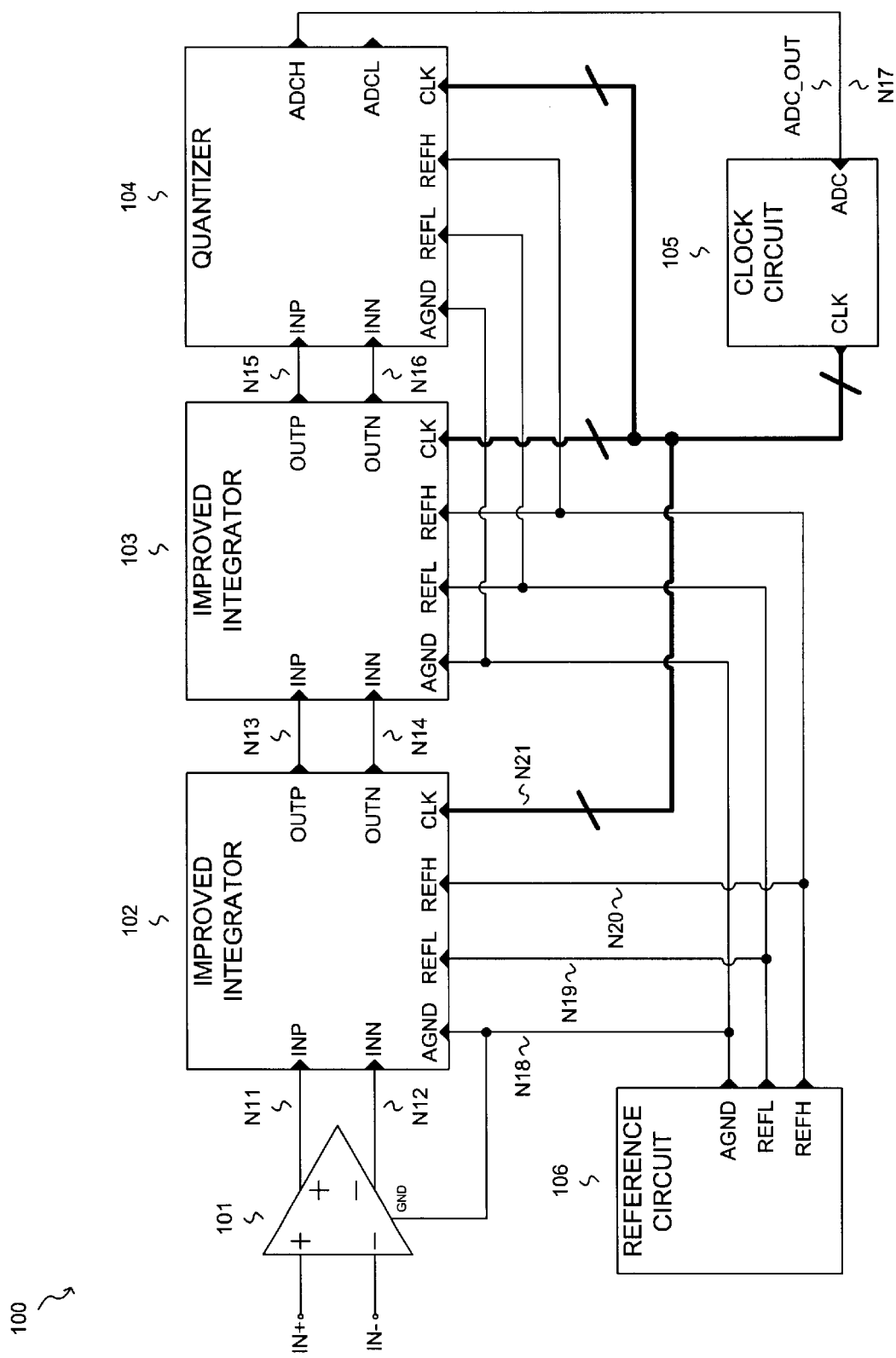
FIG. 1 is a schematic diagram illustrating an exemplary operating environment.

FIG. 1 is a schematic diagram illustrating a switched capacitor based ΔΣ-modulator ADC (100) that is in accordance with the present invention. The ΔΣ-modulator ADC (100) includes a differential amplifier circuit (101), two improved integrator circuits (102, 103), a quantizer circuit (104), a clock circuit (105), and a reference circuit (106). This ΔΣ-modulator ADC (100) is depicted as a second order system since it has two stages of integration.

The reference circuit (106) provides an analog ground signal (AGND), and two reference signals (REFL, REFH) to nodes N18, N19, and N20 respectively. The clock circuit (105) provides a bus of clocking signals (CLK) to node N21. The output of the quantizer circuit (ADC_OUT) provides a single bit output (ADC_OUT) to node N17 that is fed-back to the clock circuit (105).

In operation, a differential input signal is received by the differential amplifier (101) across the IN+ and IN− terminals. The differential amplifier (101) buffets this differential input signal and provides a first differential signal across nodes N11 and N12. The differential amplifier (101) is arranged to adjust the DC voltage levels of the first differential signal, which is centered about AGND. The first differential signal is applied to the INP and INN inputs of the first improved integrator (102). The output (OUTP, OUTN) of the first improved integrator (102) is a second differential signal that is applied across nodes N13 and N14, where it is received by the INP and INN inputs of the second improved integrator (103). The second improved integrator (103) produces a third differential signal across nodes N15 and N16 in response to the second differential signal. The quantizer circuit (104) is arranged to produce a one-bit output (ADC_OUT) at node N17 in response to the third differential signal.

The improved integrator circuits (102, 103), and the quantizer circuit (104) share common clocking signals (CLK), an analog ground (AGND), and the two reference signals (REFL, REFH). The present invention exploits the properties of switched capacitor circuits by proper arrangement of the reference signals (REFL, REFH), the analog ground signal (AGND), and the clocking signals (CLK) to adjust the common-mode input voltage of a comparator (see FIG. 2) in the quantizer circuit (104). The comparator in the quantizer circuit utilizes a feed-forward auto-zero mechanism to ensure proper quantization.

As will be discussed below with reference to FIGS. 2–4, the clock circuit is arranged to provide clocking signals that are used by the quantizer circuits. The clocking signals are arranged such that the quantizer has an initialization mode and compare mode.

Overview of the Quantizer Circuit

Figure 2:
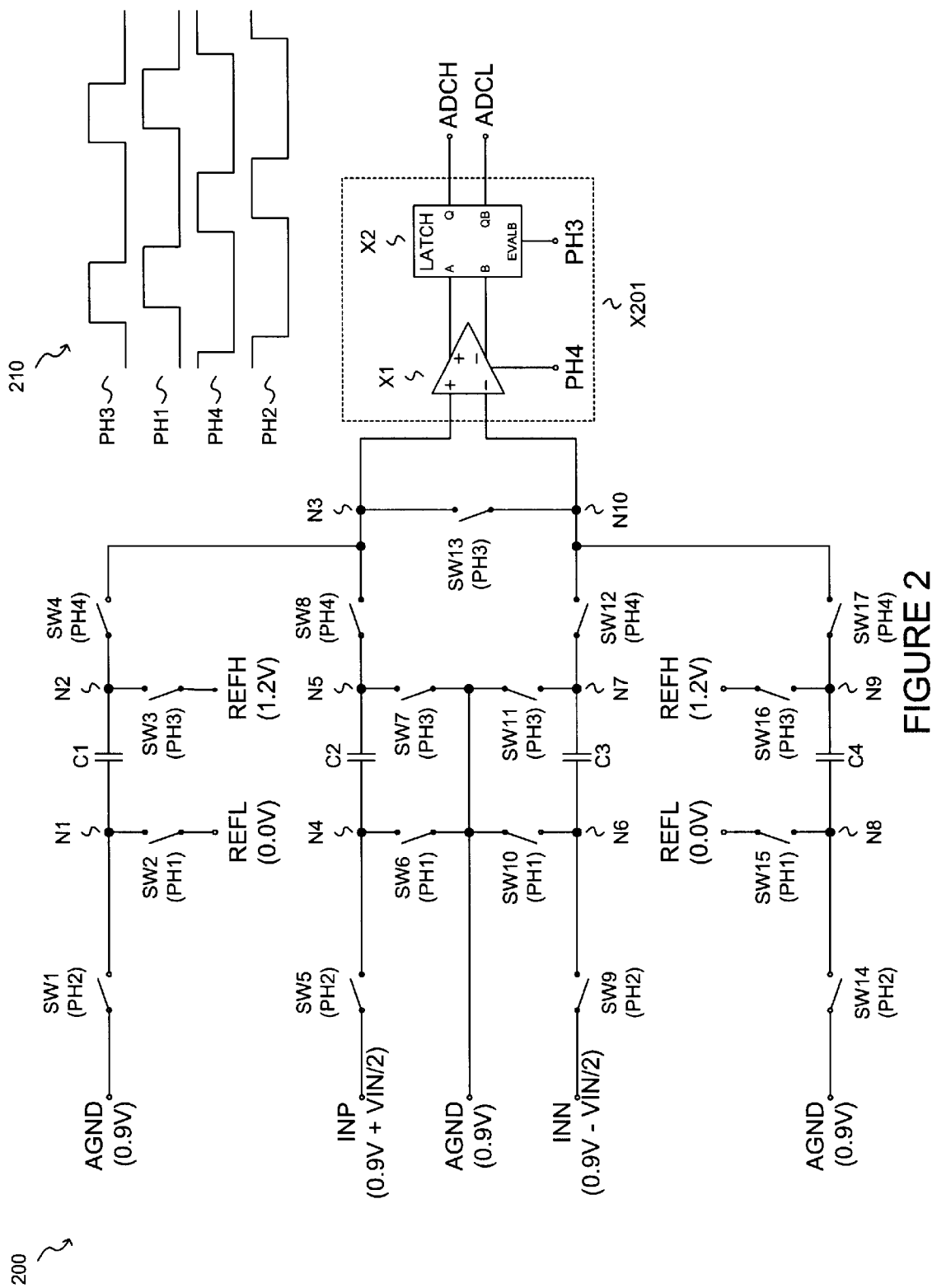
FIG. 2 is a schematic diagram illustrating a first embodiment.

FIG. 2 is a schematic diagram of a quantizer circuit (200) that is in accordance with the present invention. The quantizer (200) includes a comparator circuit (X1), a latch (X2), four capacitors (C1–C4), and seventeen switches (SW1–SW17). The circuit further includes a differential input (INP, INN), a differential output (ADCH, ADCL), a ground signal (AGND), and two reference signals (REFH, REFL).

Switch SW1 is coupled between AGND and node N1. Switch SW2 is coupled between REFL and node N1. Switch SW3 is coupled between REFH and node N2. Switch SW4 is coupled between node N2 and node N3. Switch SW5 is coupled between INP and node N4. Switch SW6 is coupled between node N4 and AGND. Switch SW7 is coupled between node N5 and AGND. Switch SW8 is coupled between node N5 and node N3. Switch SW9 is coupled between INN and node N6. Switch SW10 is coupled between node N6 and AGND. Switch SW11 is coupled between node N7 and AGND. Switch SW12 is coupled between node N7 and node N1. Switch SW13 is coupled between node N3 and node N1. Switch SW14 is coupled between AGND and node N8. Switch SW15 is coupled between REFL and node N8. Switch SW16 is coupled between REFH and node N9. Switch SW17 is coupled between node N9 and node N1. Capacitor C1 is coupled between node N1 and node N2. Capacitor C2 is coupled between node N4 and node N5. Capacitor C3 is coupled between node N6 and node N7. Capacitor C4 is coupled between node N8 and node N9. Comparator circuit X1 has a non-inverting input that is coupled to node N3, an inverting input that is coupled to node N10, an auto-zero clock input that is coupled to PH4, and a differential output that is provided to the A and 1 inputs of latch X2. Latch X2 has an EVALB input that is coupled to PH3, a Q output that is coupled to ADCH, and a QB terminal that is coupled to ADCL.

Although comparator circuit X1 and latch X2 are illustrated as separate circuits, they can be combined into a single block (X201) as illustrated by the dotted box in FIG. 2. Latch X2 may be a transparent type of latch that couples the A and B inputs to the Q and QB outputs respectively when the EVALB line is active. In one example, the EVALB input is an active low (logic "0" is active) signal.

The switches (SW1–SW17) are controlled by various clock signals (210) as illustrated in FIG. 2. As shown in the figure, four different phase clocks (PH1–PH4) are used to control the switches. Switches SW2, SW6, SW10, and SW15 are actuated by PH1. Switches SW1, SW5, SW9, and SW14 are actuated by PH2. Switches SW3, SW7, SW11, SW13, and SW16 are actuated by PH3. Switches SW4, SW8, SW12, and SW17 are actuated by PH4.

The capacitors illustrated in FIG. 2 may be integrated "on-chip" instead of being provided to the circuit as external components. Thus, manufacturing and production costs associated with the electronic system may be further reduced. The capacitors may also be replaced by one or more capacitors that are arranged in parallel, and/or in series, or some other circuit arrangement that is arranged to provide a capacitive function. In one example, capacitors C1 and C4 are matched to one another, and capacitors C2 and C3 are matched to each other. In another example, capacitors C2 and C3 are approximately twice the capacitance value of capacitors C1 and C4. In yet another example, capacitors C1–C4 are of equal values.

Although the circuit illustrated in FIG. 2 depicts single switches, the arrangement is not so limited. Any electronic circuit that is arranged, to provide a controlled switching function such as, for example, a transmission gate or a single transistor switch may replace the individual switches.

By carefully choosing the reference signals (REFH, REFL) and the ground signal (AGND) the input common-mode voltage to the comparator circuit (X1) is optimized. By maintaining a relatively constant input common-mode voltage, the amplifier may be configured to operate at very low power supplies that have been unattainable in conventional designs.

In one example of the present invention, the electronic system is powered with supply voltages of +1.8V and 0.0V. In this example, the reference signals may be derived as AGND=0.9V, REFH=1.2V, and REFL=0.0V. The 1.2V reference signal may easily be derived from a band-gap type reference generator. The 0.9V reference is easily derived from half supply circuit such as a resistor divider or alternatively from a band-gap type reference generator, while the 0V reference is simply a circuit ground. In other implementations where a regulated high power supply voltage is provided, the 1.2V reference circuit may be replaced by a connection to the high power supply voltage. The reference signals (REFH, REFL, AGND) are selectively coupled to the capacitors, where the ratios between the capacitors provide scaling, to adjust the common-mode voltage of the comparator circuit X1).

The circuit illustrated in FIG. 2 has two main operating modes: an initialization mode, and a compare mode. In operation, the initialization mode is activated before the compare mode. The operating modes for the quantizer circuit (200) will be discussed in further detail below with reference to FIGS. 3–4.

Initialization Mode Operation

Figure 3:
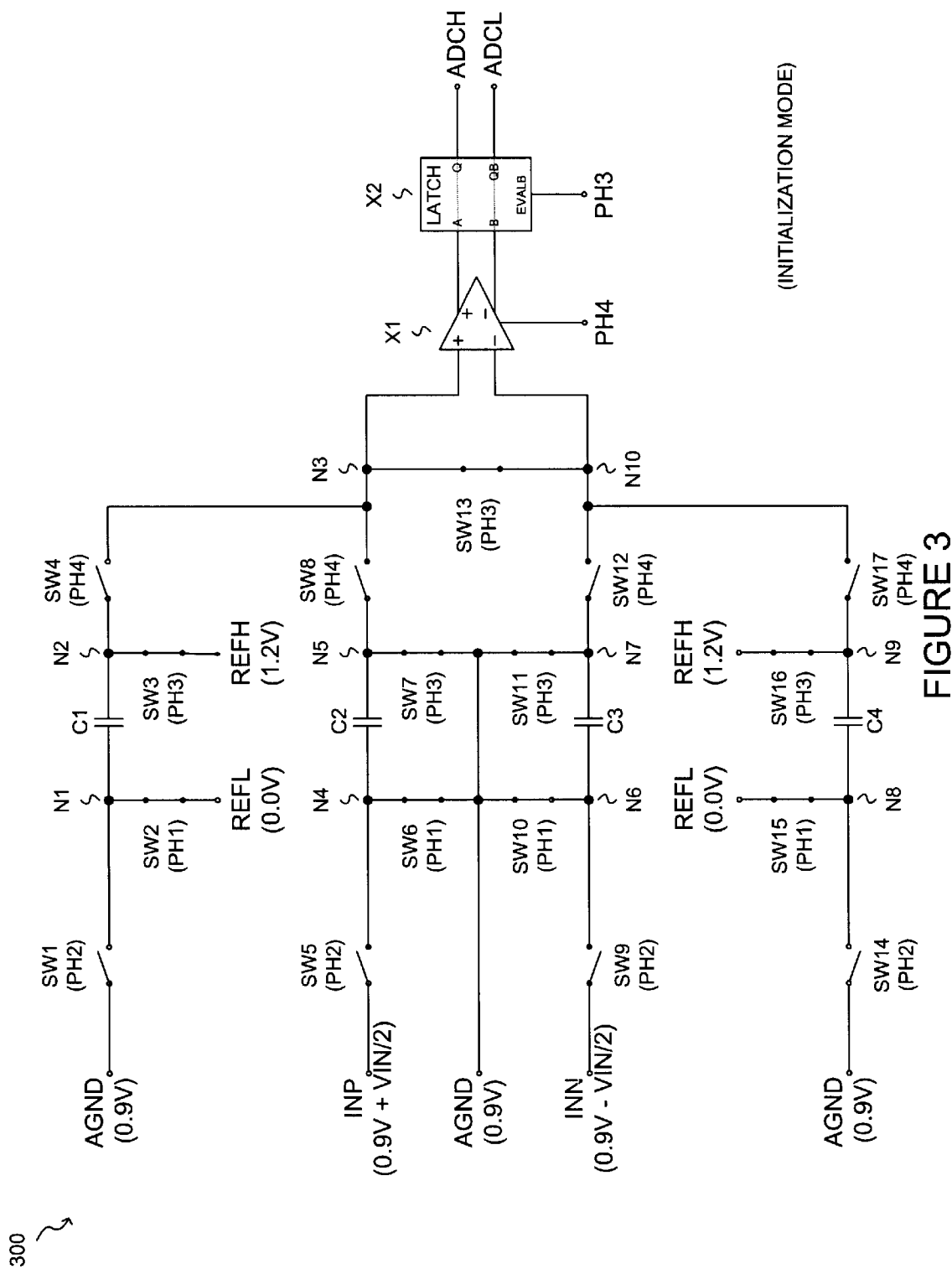
FIG. 3 is a schematic diagram illustrating the initialization mode operation of the embodiment shown in FIG. 2.

The initialization mode operation of the quantizer circuit (200) from FIG. 2 is illustrated in FIG. 3. Like components and connections from FIG. 2 are labeled identically in FIG. 3. As shown in FIG. 3, switches SW2, SW3, SW6, SW7, SW10, SW11, SW13, SW15, and SW16 are closed, while the remaining switches are open. The initialization mode is activated by clock signals PH1 and PH3.

While switches SW2 and SW3 are closed, capacitor C1 is charged to a first potential that is determined by REFL and REFH. Similarly, while switches SW15 and SW16 are closed, capacitor C4 is also charged to the first potential. The amount of charge stored in capacitors C1 and C4 are determined by their capacitance values (charge $(Q)=C*V$). When C1 and C4 are equally sized, the amount of charge stored-therein is also equal. Capacitor C1 is effectively initialized to the first potential during the initialization mode, where the first potential between nodes N1 and N2 corresponds to REFL–REFH. Similarly, capacitor C4 is initialized to the first potential during the sample mode, where the potential between nodes N8 and N9 also corresponds to REFL–REFH (the first potential). Capacitors C2 is charged to a second potential that is determined by the potential of AGND, while switches SW6 and SW7 are closed. Similarly, capacitor C3 is charged to the second potential while switches SW10 and SW11 are closed.

While switch SW13 is closed, the inverting and non-inverting input terminals of comparator circuit X1 are shorted together. By shorting these inputs together the potential at nodes N3 and N10 are initialized such that any memory on the inputs of the comparator are cleared. This memory may be due to the input capacitances of comparator circuit X1. Latch X2 is transparent in this mode such that the A and B inputs of the latch are coupled to the Q and QB outputs respectively.

Compare Mode Operation

Figure 4:
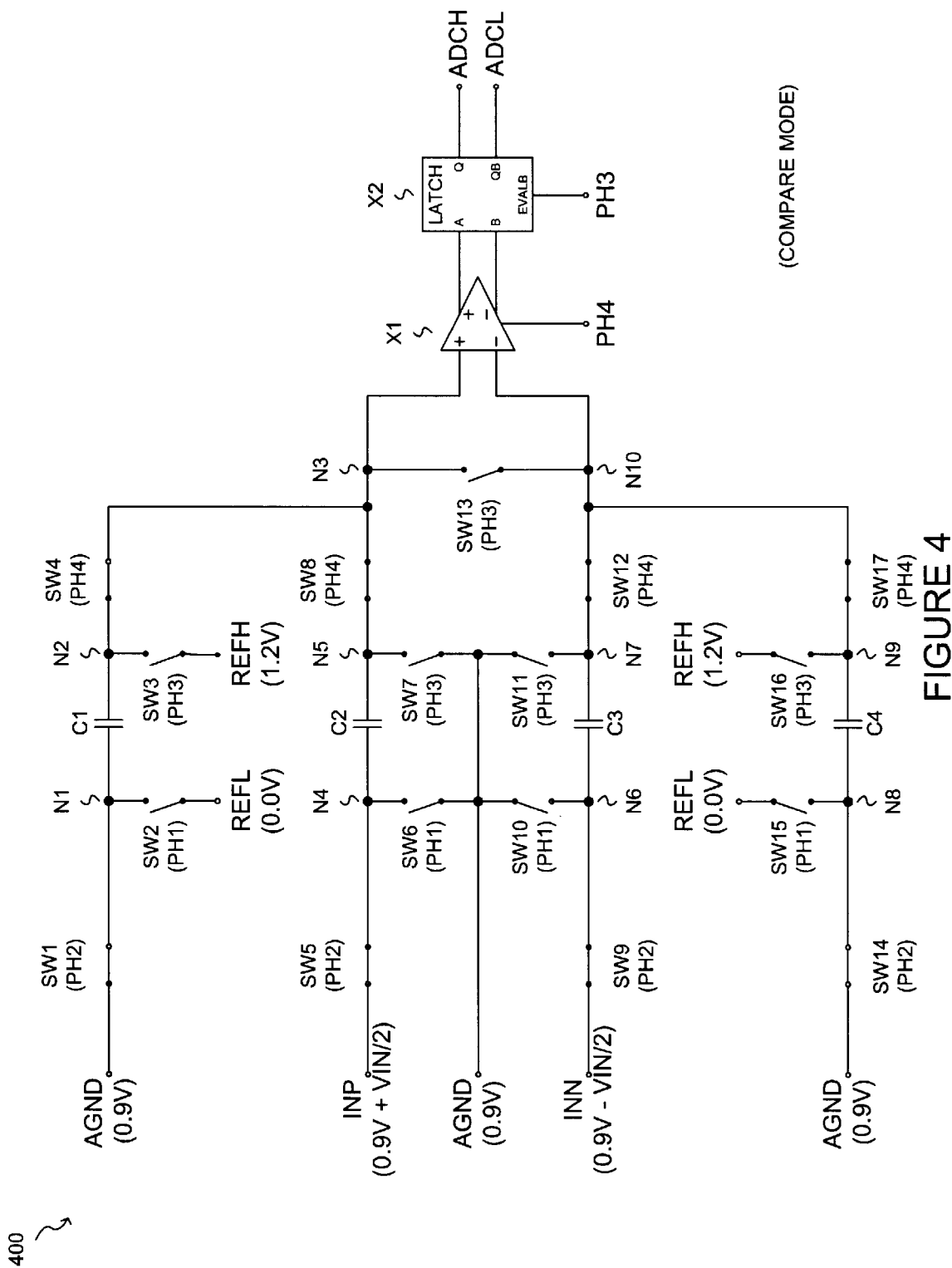
FIG. 4 is a schematic diagram illustrating the compare mode operation of the embodiment shown in FIG. 2.

The compare mode operation of the quantizer circuit (200) from FIG. 2 is illustrated in FIG. 4. Like components and connections from FIG. 2 are labeled identically in FIG. 4. As shown in FIG. 4, switches SW1, SW4, SW5, SW8, SW9, SW12, SW14, and SW17 are closed, while the remaining switches are open. The compare mode is activated by clocks signals PH2 and PH4.

The input signals for comparator X1 can be analyzed in two parts. The first part being due to the voltages charged on capacitors C1–C4 in the initialization mode, and the second part being due to an input signal that is applied to the INP and INN terminals.

While switches SW1 and SW4 are closed, AGND is coupled to one plate of capacitor C1 at node N1. The charge that was previously stored on capacitor C1 in the initialization mode (REFL–REFH) is maintained such that the charge on the other plate at node N2, that is due to the first potential from the initialization mode, is determined by (AGND–REFL+REFH)). Similarly, AGND is coupled to one plate of capacitor C4 at node N8 when switches SW15 and SW18 are closed. The charge that was previously stored on capacitor C4 in the initialization mode (first potential, REFL–REFH) is maintained such that the potential on the other plate of capacitor C4 at node N9, that is due to the first potential, is determined by (AGND–REFL+REFH).

While switches SW5 and SW8 are closed a signal path is formed from INP through capacitor C2 to the non-inverting input of comparator X1. Since switches SW1, SW4, SW5 and SW8 are all closed, a conduction path continues from node N3 through capacitor C1 to AGND. When an input signal such as AGND+V1 is applied to the INP terminal, the voltage at node N3 may be analyzed in two parts using superposition.

The first part is analyzed by considering the AGND portion of the input signal. In the initialization mode, capacitor C1 was charged to REFH−REFL, and capacitor C2 was discharged to AGND. At the beginning of the compare mode capacitor C1 has a charge stored thereon given by: Q1=C1*(REFH−REFL), and capacitor C2 is discharged so Q2=0. During the compare mode capacitors C1 and C2 are both effectively coupled to AGND on one plate and the charges on the capacitors are redistributed such that Qtotal= Q1+Q2. Applying conservation of charge principles, the first part of the voltage at node N3 is determined by: AGND+ Qtotal/(C1+C2) AGND+(REFH−REFL)/(1+C2/C1)). When C2=2*C1, the voltage is reduced to: AGND+(REFH− REFL)/3. The second part is analyzed by considering the V1 portion of the input signal. Since C2 and C1 are connected in series in the compare mode, they form a voltage divider for the input signal. The second part of the voltage at N3 is given by: V1*C1/(C1+C2) or V1/(1+C2/C1). When C2=2*C1, the second part of the voltage is reduced to V1/3.

The total voltage is obtained by adding the two solutions together. VN3=AGND+(REFH−REFL+V1)/(1+C2/C1). The solution for node N10 is similarly obtained by applying another input signal (AGND−V2) to the INN terminal. The voltage at N10 is given as: VN10=AGND+(REFH−REFL− V2)/(1+C2/C1). By inspection, the common-mode voltage of comparator X1 during the compare mode is given as: VCM=AGND+(VREFH−VREFL)/(1+C2/C1).

In operation, a differential input signal (Vin) is applied across the input terminals INP and INN. The input signal to the INP terminal is given by: AGND+Vin/2, while the input signal to the INN terminal is given by: AGND−Vin/2. The charges that were stored on capacitors C1–C4 during the initialization mode are used to adjust the common-mode input voltage (VCM) of comparator circuit X1. The result of the switched capacitor operation is that comparator circuit X1 receives (VCM+Vin/(1+C2/C1)), and (VCM−Vin/(1+ C2/C1)) across the non-inverting and inverting inputs respectively during the compare mode. For example, when 0.9V+Vin/2 is applied to the INP terminal and 0.9V−Vin/2 is applied to the INN terminal, and C2=2*C1, the differential signal applied across the inverting and non-inverting terminals of comparator X1 is (1.3V+Vin/3) and (1.3V−Vin/3) respectively.

Comparator X1 provides a differential output signal in response to the differential signal that is applied across the inverting and non-inverting inputs at nodes N3 and N10. The differential output signal is a differential logic level signal that is determined by a positive (VDD) and negative (VSS) power supply voltage (not shown). In one example, VDD= 1.8V, VSS=0V, and the differential output signal corresponds to +1.8V or −1.8V differentially. The differential output signal is coupled to the A and B inputs of the latch (X2), which latches the A and B inputs to the Q and QB outputs on the falling edge of clock signal PH3. Thus, the output of the ADC does not change until the falling edge of clock signal PH3.

Comparator X1 illustrated in FIGS. 2–4 is a unit-delay comparator that evaluates the potentials at nodes N3 and N10 when activated. A detailed discussion of an exemplary comparator circuit that is suitable in the present invention follows below with reference to FIG. 5.

Exemplary Comparator Circuit

Figure 5:
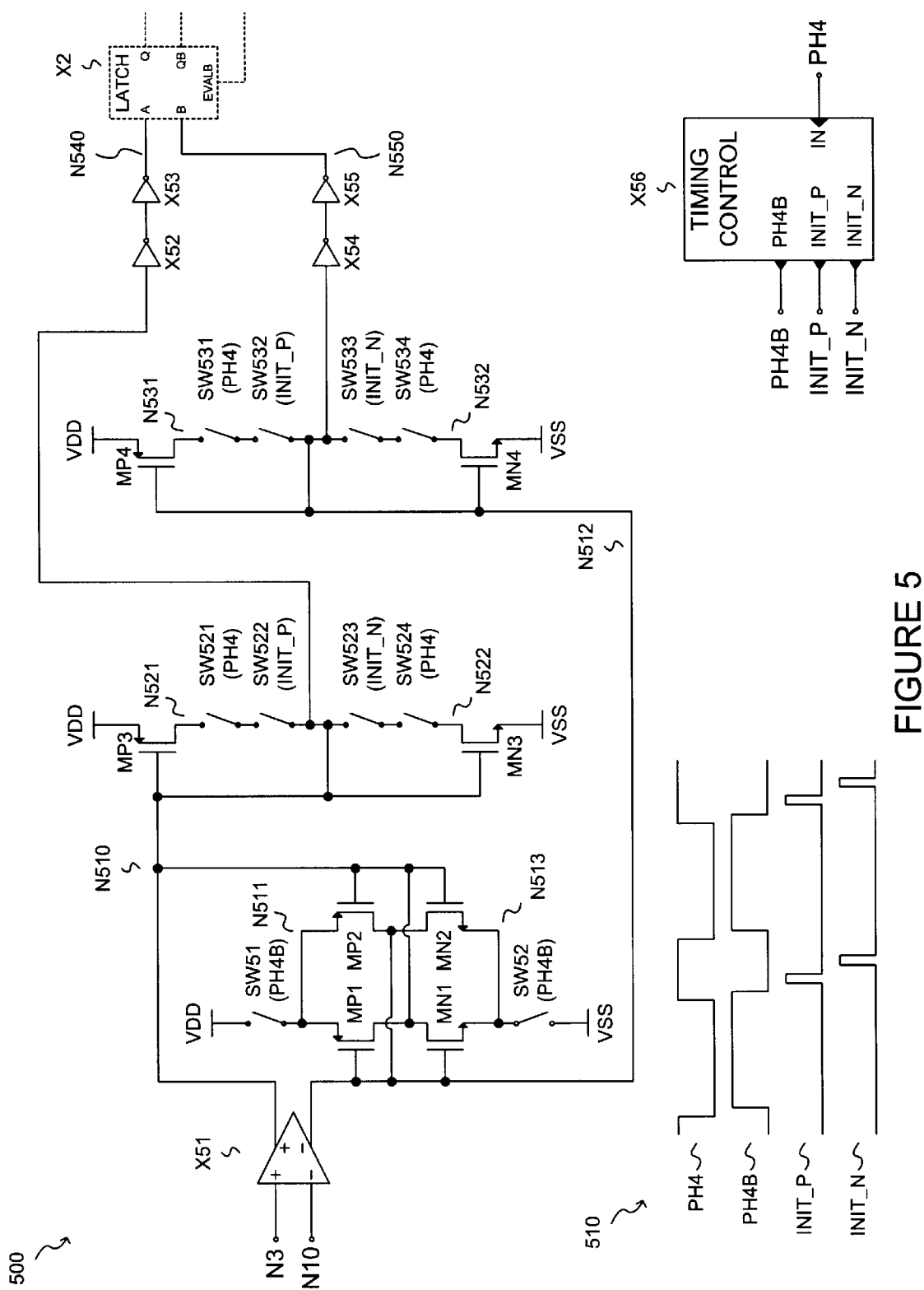
FIG. 5 is a schematic diagram of an exemplary comparator circuit for use in FIG. 2, in accordance with the present invention.
Figure 6:
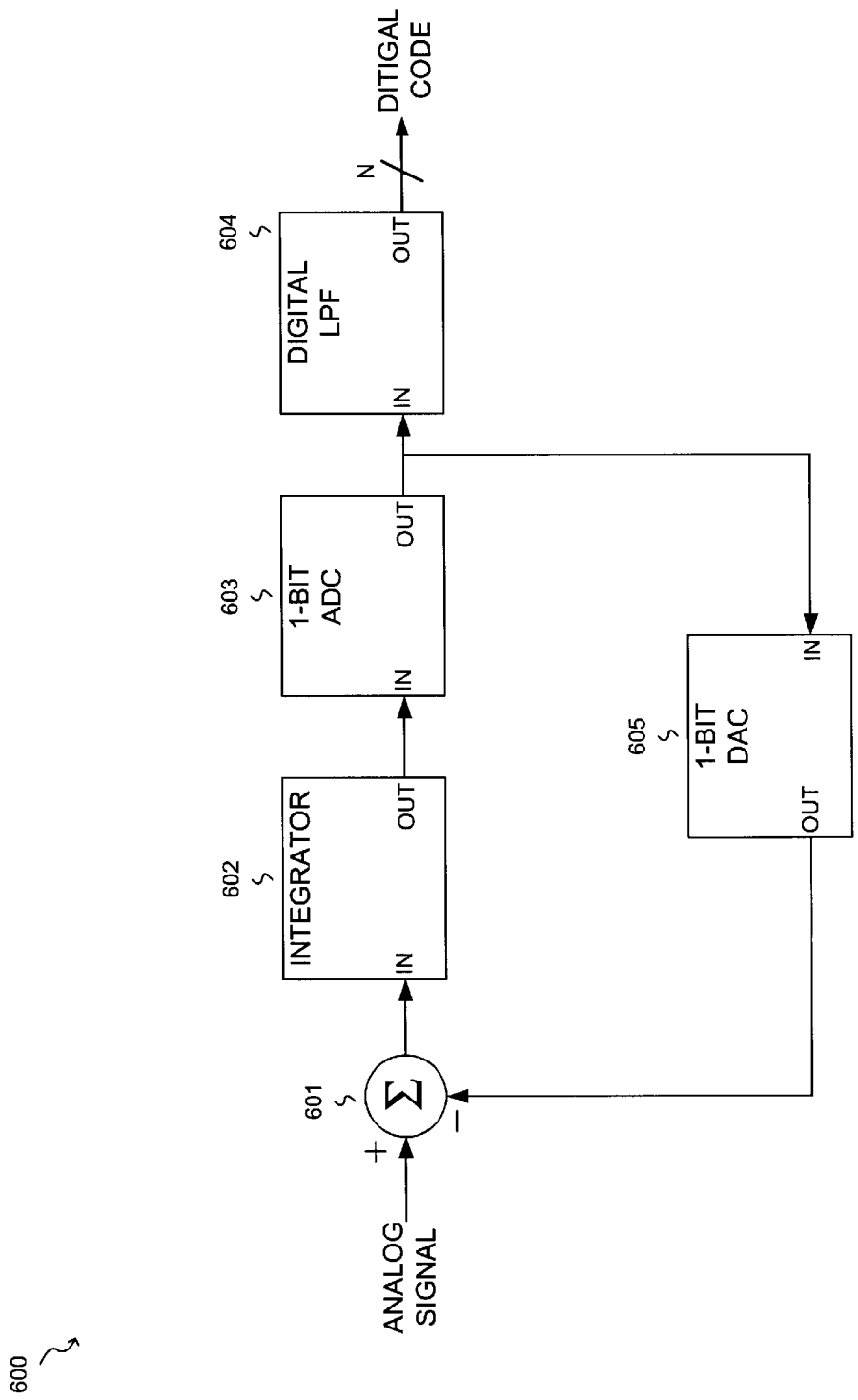
FIG. 6 is a block diagram of a first-order ΔΣ-modulator system.

FIG. 5 is a schematic diagram illustrating an exemplary comparator circuit (500) that is in accordance with the present invention. Like components and connections from FIG. 2 are labeled identically in FIG. 5. The comparator circuit (500) includes a differential amplifier (X51), four PMOS transistors (MP1–MP4), four NMOS transistors (MN1–MN4), four inverters (X52–X55), a timing control circuit (X56), and ten switches (SW51–SW52, SW521–SW524, SW531–SW534).

Differential amplifier X51 has a non-inverting input that is coupled to node N3, an inverting input that is coupled to node N11, a non-inverting output that is coupled to node N510, and an inverting output that is coupled to node N512. Switch SW51 is coupled between VDD and node N511. Transistor MP1 has a gate that is coupled to node N512, a drain that is coupled to node N510, and a source that is coupled to node N511. Transistor MP2 has a gate that is coupled to node N510, a drain that is coupled to node N512, and a source that is coupled to node N511. Transistor MN1 has a gate that is coupled to node N512, a drain that is coupled to node N510, and a source that is coupled to node N513. Transistor MN2 has a gate that is coupled to node N510, a drain that is coupled to node N512, and a source that is coupled to node N513. Switch SW52 is coupled between VSS and node N513.

Transistor MP3 has a gate that is coupled to node N510, a drain that is coupled to node N521, and a source that is coupled to VDD. Switch SW521 and SW522 are coupled in series between node N521 and node N510. Switch SW523 and SW524 are coupled in series between node N510 and node N522. Transistor MN3 has a gate that is coupled to node N510, a drain that is coupled to node N522, and a source that is coupled to VSS. Transistor MP4 has a gate that is coupled to node N512, a drain that is coupled to node N531, and a source that is coupled to VDD. Switch SW531 and SW532 are coupled in series between node N531 and node N512. Switch SW533 and SW534 are coupled in series between node N512 and node N532. Transistor MN4 has a gate that is coupled to node N512, a drain that is coupled to node N532, and a source that is coupled to VSS. Inverters X52 and X53 are series coupled between node N510 and node N540. Inverters X54 and X55 are series coupled between node N512 and node N550.

Nodes N3 and N10 operate as a differential input to comparator circuit 500. Nodes N540 and N550 are coupled to the A and B inputs of a latch circuit such as latch circuit X2 previously described with respect to FIGS. 2–4. Thus, nodes N540 and N550 operate as a differential output of comparator circuit 500.

Timing control circuit X56 provides timing control signals PH4B, INIT_P and NIT_N in response to the PH4 clock signal. A timing chart (510) is shown on FIG. 5 for the control signals (PH4, NIT_P, NIT_N). The PH4B signal is essentially an inverse of the PH4 signal. The MNIT_P and INIT_N signals are illustrated as pulses that occur when the PH4 signal is high (logic "1"). Switches SW51 and SW52 are actuated in response to a high (logic "1") PH4B clock signal. Switches SW521, SW524, SW531, and SW534 are actuated in response to a high (logic "1") PH4 clock signal. Switches SW522 and SW532 are actuated in response to a high (logic "1") INIT_P signal. Switches SW523 and SW533 are actuated in response to a high (logic "1") INIT_N signal. Although the pulse for INIT_P is illustrated as preceding NIT_N in timing chart 510, they may be arranged in the opposite order.

Although the circuit illustrated in FIG. 5 depicts single switches, the arrangement is not so limited. Any electronic circuit that is arranged to provide a controlled switching function such as, for example, a transmission gate or a single transistor switch may replace the individual switches. Also, one or more of the switches may be combined into a single switch.

The circuit illustrated in FIG. 5 has four operating phases that occur in order: a first initialization phase, a second initialization phase, an amplification phase, and a decision phase. The operation of each phase is described below with reference to FIGS. 2 and 5.

First Initialization Phase

The PH4 clock signal is a high signal (logic "1"), and the INIT_P signal pulses to a high signal (logic "1") during the first initialization phase. The actuation of switches SW521 and SW522 form a conduction path between the drain and gate of transistor MP3 such that transistor MP3 is configured as a diode connected device. Similarly, the actuation of switches SW531 and SW532 form a conduction path between the drain and gate of transistor MP4 such that transistor MP4 is configured as a diode connected device.

During the first initialization phase, the outputs of the differential amplifier (nodes N510 and N512) are drawn towards VDD (e.g., VDD=1.8V) through diode-connected devices MP3 and MP4 respectively. An output of the differential amplifier that was previously a low logic level (logic "0") will be drawn within one diode voltage of VDD as determined by the threshold potentials of transistor MP3 and MP4 (e.g., VTP=−1V). Thus, a previously low logic level output will be drawn towards VDD+VTP (e.g., 1.8V−1V=0.8V), and a high logic level output (e.g., 1.8V) will remain high.

Second Initialization Phase

The PH4 clock signal is a high signal (logic "1"), and the INMT_N signal pulses to a high signal (logic "1") during the second initialization phase. The actuation of switches SW523 and SW524 form a conduction path between the drain and gate of transistor MN3 such that transistor MN3 is configured as a diode connected device. Similarly, the actuation of switches SW533 and SW534 form a conduction path between the drain and gate of transistor MN4 such that transistor MN4 is configured as a diode connected device.

During the second initialization phase, the outputs of the differential amplifier (nodes N510 and N512) are drawn towards VSS (e.g., VSS=0V) through diode-connected devices MN3 and MN4 respectively. An output of the differential amplifier that was previously initialized near VDD in the first initialization phase will be drawn within one diode voltage of VSS as determined by the threshold potentials of transistors MN3 and MN4 (e.g., VTN=+1V). Thus, the output potentials at nodes N510 and N512 will be drawn towards VSS+VTN (e.g., +1V).

After the conclusion of the first and second initialization phases, the outputs of the differential amplifier at nodes N510 and N512 will have potentials that are approximately equal (no differential voltage). Thus, nodes N510 and N512 are initialized so that the next amplification and decision phase will operate properly. The initialization phases operate as an auto-zero function for the comparator.

The first and second initialization phases described above may be initiated in the reverse order to that described above. For example, the second initialization phase can be applied first, followed by the first initiation phase such that the potentials at nodes N510 and N512 will be initialized first to VSS+VTN, and second to VDD+VTP.

Amplification Phase

The amplification phase follows the conclusion of both initialization phases. During the amplification phase, the PH4 clock signal is a high signal (logic "1"), and the NIT_N and INIT_P signals are a low logic level (logic "0"). Differential amplifier X51 amplifies the differential input signals from nodes N3 and N10 to produce a differential output signal at nodes N510 and N512. The potentials at nodes N510 and N512 will correspond to an amplified version of the differential signal sensed at node N3 and N10.

Decision Phase

The decision phase follows the conclusion of the amplification phase. During the decision phase, the PH4B clock signal is a high signal (logic "1"), and the MNIT_N and INIT_P signals are a low logic level (logic "0"). When the PH4B clock signal changes to a high state (logic "1"), transistors MP1–MP2, MN1–MN2 operate as a pair of cross-coupled inverters that provide positive feedback. Transistors MP1 and MN1 operate as an inverter between nodes N512 and N510 when switches SW51 and SW52 are actuated. Similarly, MP2 and MN2 operate as another inverter between nodes N510 and N512. Since the output of each of these inverters is coupled to the others input, the inverters provide a form of positive feedback. The differential output signal that was provided at nodes N510 and N512 at the conclusion of the amplification phase is further amplified using the positive feedback of the cross-coupled inverters. The cross-coupled inverter will draw one of the outputs to VDD and the other to VSS resulting in a logical decision.

Inverters X52–X53 and X54–X55 are arranged to further amplify the logical decision such that a clear logical decision is latched into latch X2 at the conclusion of the decision phase. Inverters X52 and X54 can be implemented as CMOS inverters that each includes a PMOS and an NMOS transistor. The size ratios of the PMOS and the NMOS transistors can be adjusted so that the threshold of the inverter is not in the center of the supply range. In other words, the threshold of the inverter can be skewed. Skewing the inverter thresholds may minimize power consumption during the initialization phase.

During the decision phase, latch X2 is transparent. At the conclusion of the decision phase, the clear logical decision is stored in the latch as previously described above. Alternatively, another memory circuit can be used in place of latch X2.

Although the preceding description describes various embodiments of the system, the invention is not limited to such embodiments, but rather covers all modifications, alternatives, and equivalents that fall within the spirit and scope of the invention. Since many embodiments of the invention can be made without departing from the spirit and scope of the invention, the invention resides in the claims hereinafter appended.

I claim:

1. An apparatus that provides a quantized differential output signal in response to a differential input signal, comprising:

a differential amplifier that includes a differential input that is coupled to the differential input signal, and a first and second output that are arranged to provide a differential intermediate signal in response to the differential input signal during an amplification phase, wherein the amplification phase is activated after an initialization phase is complete;

an auto-zero circuit that is coupled to the first and second output of the differential amplifier and is isolated from the differential input of the differential amplifier, wherein the auto-zero circuit is arranged to initialize the differential intermediate signal during an initialization phase such that the differential intermediate signal is substantially zero differentially after the initialization phase is complete; and a positive gain circuit that is coupled to the differential output of the differential amplifier, wherein the positive gain circuit is arranged to increase the gain of the differential intermediate signal using positive feedback during a decision phase such that the differential intermediate signal saturates to a differential logic level, wherein the decision phase is activated after the amplification phase is complete and the quantized differential output signal is associated with the differential intermediate signal at the end of the decision phase.

2. An apparatus as in claim 1, the auto-zero circuit further comprising:

a first selectable diode circuit that is selectively coupled between the first output of the differential amplifier and a first potential during a first portion of the initialization phase;

a second selectable diode circuit that is selectively coupled between the second output of the differential amplifier and the first potential during the first portion of the initialization phase;

a third selectable diode circuit that is selectively coupled between the first output of the differential amplifier and a second potential during a second portion of the initialization phase; and a fourth selectable diode circuit that is selectively coupled between the second output of the differential amplifier and the second potential during the second portion of the initialization phase, whereby the first and second outputs of the differential amplifier are initialized to a zeroed condition such that the potential of the first output of the differential amplifier is substantially the same as the potential at the second output of the differential amplifier.

3. An apparatus as in claim 2, wherein the first potential corresponds to a first power supply potential, and the second potential corresponds to a second power supply potential.

4. An apparatus as in claim 2, wherein the first and second selectable diode circuits each include a PMOS transistor and a switching circuit that is arranged to coupled the drain and the gate of the PMOS transistor together when the switching circuit is actuated, and wherein the third and fourth selectable diode circuits each include an NMOS transistor and another switching circuit that is arranged to couple the drain and gate of the NMOS transistor together when the switching circuit is actuated.

5. An apparatus as in claim 4, wherein the PMOS transistor in each of the first and second selectable diode circuits have a source that is coupled to a first potential, and wherein the NMOS transistor in each of the third and fourth selectable diode circuit have a source that is coupled to a second potential that is lower than the first potential.

6. An apparatus as in claim 2, wherein the first and second selectable diode circuits each include an NMOS transistor and a switching circuit that is arranged to coupled the drain and the gate of the NMOS transistor together when the switching circuit is actuated, and wherein the third and fourth selectable diode circuits each include a PMOS transistor and another switching circuit that is arranged to couple the drain and gate of the PMOS transistor together when the switching circuit is actuated.

7. An apparatus as in claim 1, further comprising a first output circuit that has an input that is coupled to the first of the differential amplifier, and a second output circuit that has an input that is coupled to the second output of the differential amplifier.

8. An apparatus as in claim 7, wherein the first output circuit includes a skewed CMOS inverter that includes a PMOS transistor and an NMOS transistor that are sized such that the threshold of the skewed CMOS inverter is skewed towards one of two power supplies such that the skewed CMOS inverter consumes low power.

9. An apparatus as in claim 1, the positive gain circuit further comprising a cross-coupled inverter circuit that is disabled during the initialization and amplification phase, and enabled during the decision phase.

10. An apparatus as in claim 1, further comprising a cross-coupled inverter circuit, comprising:

a first inverter circuit that has an input that is coupled to the first output of the differential amplifier and an output that is coupled to the second output of the differential amplifier; and a second inverter circuit that has an input that is coupled to the second output of the differential amplifier and an output that is coupled to the first output of the differential amplifier such that the first and second inverter are arranged to provide positive feed-back with respect to one another.

11. An apparatus as in claim 10, wherein the first inverter circuit includes a first CMOS inverter and a first switching circuit that is arranged to selectively activate the first CMOS inverter when actuated, and wherein the second inverter circuit includes a second CMOS inverter and a second switching circuit that is arrange to selectively activate the second CMOS inverter when actuated.

12. An apparatus as in claim 1, further comprising a switched capacitor circuit that is arranged to adjust the common-mode input voltage of the differential amplifier.

13. An apparatus as in claim 12, wherein the switched capacitor circuit includes a switching circuit that is arranged to selectively short the differential input signal such that the differential amplifier has a zero difference differential input signal during the initialization phase.

14. An apparatus as in claim 12, the switched capacitor circuit further comprising:

a first, second, third, and fourth capacitance circuit;

a first and second switching circuit that are arranged to initialize the first and fourth capacitance circuits, respectively, to a first potential when the switched capacitor circuit is in an initialization mode;

a third and fourth switching circuit that are arranged to initialize the second and third capacitance circuits, respectively, to a second potential when the switched capacitor circuit is in the initialization mode;

a fifth switching circuit that is arranged to couple a first reference signal to the first capacitance circuit when the switched capacitor circuit is in a compare mode;

a sixth switching circuit that is arranged to couple the first reference signal to the fourth capacitance circuit when the switched capacitor circuit is in the compare mode;

a seventh switching circuit that is arranged to couple the first and second capacitance circuits to a first portion of the differential input of the differential amplifier the switched capacitor circuit is in the compare mode; and an eighth switching circuit that is arranged to couple the third and fourth capacitance circuits to a second portion of the differential input of the differential amplifier when the switched capacitor circuit is in the compare mode, such that the common-mode input voltage of the differential amplifier is determined by at least the first potential and the second potential.

15. An apparatus as in claim 14, wherein the first potential and the second potential are the same, and the first reference signal is a mid-supply voltage.

16. An apparatus for quantizing a differential input signal, comprising:

a means for adjusting that is arranged to receive the differential input signal and provide a first intermediary differential signal that corresponds to the differential input signal with an adjusted common-mode voltage;

a means for amplifying that is arranged to receive the first intermediary differential signal and provide a second intermediary differential signal when the apparatus is in an amplification phase after an initialization phase is complete, wherein the second intermediary differential signal corresponds to the first intermediary differential signal that is increased in amplitude by a gain factor;

a means for disabling that is arranged to disable the means for amplifying when the apparatus is in the initialization phase;

a means for initializing that is coupled to the means for amplifying and arranged to initialize the second intermediary differential signal during the initialization phase such that the second intermediary differential signal is substantially zero at the end of the initialization phase;

a means for providing positive feedback that is coupled to the means for amplifying and arranged to increase the amplitude of the second intermediary differential signal using positive feedback during a decision phase such that the increased amplitude corresponds to a logic level, the means for providing positive feedback being isolated from the first intermediate differential signal; and a means for storing that is coupled to the increased amplitude second intermediary signal and arranged to store the logic level of the increased amplitude second intermediary signal at the end of the decision phase.

17. A method for quantizing a differential input signal, comprising:

adjusting the common-mode voltage of the differential input signal to provide an intermediary signal;

amplifying the first intermediary signal to provide an amplified signal during an amplification phase and after an initialization phase;

initializing the amplified signal to a value that corresponds to a zero difference differential signal during the initialization phase;

providing positive feedback to the amplified signal to provide a decision signal during a decision phase and after the amplification phase, wherein the decision signal is a logic level signal that is associated with the polarity of the amplified signal; and latching the decision signal at the conclusion of the decision phase to provide a quantized signal.

18. An apparatus that provides a quantized differential output signal in response to a differential input signal, comprising:

a differential amplifier that includes a differential input that is coupled to the differential input signal, and a first and second output that are arranged to provide a differential intermediate signal in response to the differential input signal during an amplification phase, wherein the amplification phase is activated after an initialization phase is complete;

an auto-zero circuit that is coupled to the first and second output of the differential amplifier, wherein the auto-zero circuit is arranged to initialize the differential intermediate signal during an initialization phase such that the differential intermediate signal is substantially zero differentially after the initialization phase is complete;

a positive gain circuit that is coupled to the differential output of the differential amplifier, wherein the positive gain circuit is arranged to increase the gain of the differential intermediate signal using positive feedback during a decision phase such that the differential intermediate signal saturates to a differential logic level, wherein the decision phase is activated after the amplification phase is complete and the quantized differential output signal is associated with the differential intermediate signal at the end of the decision phase;

a first selectable diode circuit that is selectively coupled between the first output of the differential amplifier and a first potential during a first portion of the initialization phase;

a second selectable diode circuit that is selectively coupled between the second output of the differential amplifier and the first potential during the first portion of the initialization phase;

a third selectable diode circuit that is selectively coupled between the first output of the differential amplifier and a second potential during a second portion of the initialization phase; and a fourth selectable diode circuit that is selectively coupled between the second output of the differential amplifier and the second potential during the second portion of the initialization phase, whereby the first and second outputs of the differential amplifier are initialized to a zeroed condition such that the potential of the first output of the differential amplifier is substantially the same as the potential at the second output of the differential amplifier.

19. An apparatus as in claim 18, wherein the first potential corresponds to a first power supply potential, and the second potential corresponds to a second power supply potential.

20. An apparatus as in claim 18, wherein the first and second selectable diode circuits each include a PMOS transistor and a switching circuit that is arranged to coupled the drain and the gate of the PMOS transistor together when the switching circuit is actuated, and wherein the third and fourth selectable diode circuits each include an NMOS transistor and another switching circuit that is arranged to couple the drain and gate of the NMOS transistor together when the switching circuit is actuated.

21. An apparatus as in claim 20, wherein the PMOS transistor in each of the first and second selectable diode circuits have a source that is coupled to a first potential, and wherein the NMOS transistor in each of the third and fourth selectable diode circuit have a source that is coupled to a second potential that is lower than the first potential.

22. An apparatus as in claim 18, wherein the first and second selectable diode circuits each include an NMOS transistor and a switching circuit that is arranged to coupled the drain and the gate of the NMOS transistor together when the switching circuit is actuated, and wherein the third and fourth selectable diode circuits each include a PMOS transistor and another switching circuit that is arranged to couple the drain and gate of the PMOS transistor together when the switching circuit is actuated.

23. An apparatus that provides a quantized differential output signal in response to a differential input signal, comprising:

a differential amplifier that includes a differential input that is coupled to the differential input signal, and a first and second output that are arranged to provide a differential intermediate signal in response to the differential input signal during an amplification phase, wherein the amplification phase is activated after an initialization phase is complete;

an auto-zero circuit that is coupled to the first and second output of the differential amplifier, wherein the auto-zero circuit is arranged to initialize the differential intermediate signal during an initialization phase such that the differential intermediate signal is substantially zero differentially after the initialization phase is complete;

a positive gain circuit that is coupled to the differential output of the differential amplifier, wherein the positive gain circuit is arranged to increase the gain of the differential intermediate signal using positive feedback during a decision phase such that the differential intermediate signal saturates to a differential logic level, wherein the decision phase is activated after the amplification phase is complete and the quantized differential output signal is associated with the differential intermediate signal at the end of the decision phase; and a first output circuit that has an input that is coupled to the first output of the differential amplifier, and a second output circuit that has an input that is coupled to the second output of the differential amplifier, wherein the first output circuit includes a skewed CMOS inverter that includes a PMOS transistor and an NMOS transistor that are sized such that the threshold of the skewed CMOS inverter is skewed towards one of two power supplies such that the skewed CMOS inverter consumes low power.

24. An apparatus that provides a quantized differential output signal in response to a differential input signal, comprising:

a differential amplifier that includes a differential input that is coupled to the differential input signal, and a first and second output that are arranged to provide a differential intermediate signal in response to the differential input signal during an amplification phase, wherein the amplification phase is activated after an initialization phase is complete;

an auto-zero circuit that is coupled to the first and second output of the differential amplifier, wherein the auto-zero circuit is arranged to initialize the differential intermediate signal during an initialization phase such that the differential intermediate signal is substantially zero differentially after the initialization phase is complete;

a positive gain circuit that is coupled to the differential output of the differential amplifier, wherein the positive gain circuit is arranged to increase the gain of the differential intermediate signal using positive feedback during a decision phase such that the differential intermediate signal saturates to a differential logic level, wherein the decision phase is activated after the amplification phase is complete and the quantized differential output signal is associated with the differential intermediate signal at the end of the decision phase; and a cross-coupled inverter circuit comprising:
 a first inverter circuit that has an input that is coupled to the first output of the differential amplifier and an output that is coupled to the second output of the differential amplifier; and
 a second inverter circuit that has an input that is coupled to the second output of the differential amplifier and an output that is coupled to the first output of the differential amplifier such that the first and second inverter are arranged to provide positive feedback with respect to one another.

25. An apparatus as in claim 24, wherein the first inverter circuit includes a first CMOS inverter and a first switching circuit that is arranged to selectively activate the first CMOS inverter when actuated, and wherein the second inverter circuit includes a second CMOS inverter and a second switching circuit that is arrange to selectively activate the second CMOS inverter when actuated.

* * * * *

UNITED STATES PATENT AND TRADEMARK OFFICE
CERTIFICATE OF CORRECTION

PATENT NO. : 6,630,898 B1
DATED : October 7, 2003
INVENTOR(S) : Stegers

It is certified that error appears in the above-identified patent and that said Letters Patent is hereby corrected as shown below:

Title page,
Item [56], References Cited, U.S. PATENT DOCUMENTS,
"6,242,974 B1 6/2001 Kunst" should read -- 6,242,974 B1 Kinst --

Column 4,
Line 1, "The differential amplifier (101) buffets" should read -- The differential amplifier (101) buffers --
Line 55, "between node N7 and node N1" should read -- between node N7 and node N10 --
Line 56, "between node N3 and node N1" should read -- between node N7 and node N10 --
Line 60, "between node N9 and node N1" should read -- between node N9 and node N10 --

Column 5,
Line 1, "provided to the A and 1" should read -- provided to the A and B --

Column 8,
Line 14, "node N11, a non-inverting output" should read -- node N10, a non-inverting output --
Line 53, "and NIT_N in response to" should read -- and INIT_N in response to --
Line 55, "control signals (PH4, NIT_P, NIT_N)." should read -- control signals (INIT_P, INIT_N). --
Line 56, "the MNIT_P and" should read -- The INIT_P and --
Line 66, "preceding NIT_N in timing " should read -- preceding INIT_N in timing --

Column 9,
Line 40, "INMT_N signal pulses" should read -- INIT signal pulses --

UNITED STATES PATENT AND TRADEMARK OFFICE
CERTIFICATE OF CORRECTION

PATENT NO.   : 6,630,898 B1
DATED        : October 7, 2003
INVENTOR(S)  : Stegers It is certified that error appears in the above-identified patent and that said Letters Patent is hereby corrected as shown below:

<u>Column 10,</u>
Line 9, and the NIT_N" should read -- INIT_N --
Line 20, "and the MNIT_N" should read -- and the INIT --

Signed and Sealed this

Twenty-third Day of March, 2004

JON W. DUDAS
*Acting Director of the United States Patent and Trademark Office*